United States Patent [19]
Shoji

[11] Patent Number: 5,853,602
[45] Date of Patent: Dec. 29, 1998

[54] METHOD OF DRY ETCHING FOR PATTERNING REFRACTORY METAL LAYER IMPROVED IN ETCHING RATE, ANISOTROPY AND SELECTIVITY TO SILICON OXIDE

[75] Inventor: Hideyuki Shoji, Tokyo, Japan

[73] Assignee: NEC Corporation, Tokyo, Japan

[21] Appl. No.: 799,883

[22] Filed: Feb. 13, 1997

[30]     Foreign Application Priority Data

Feb. 16, 1996  [JP]  Japan ..................................... 8-028891

[51] Int. Cl.⁶ ....................................................... C23F 1/12
[52] U.S. Cl. ................................ 216/46; 216/64; 216/67; 216/75; 438/695; 438/704; 438/714; 438/720; 438/963
[58] Field of Search ...................... 438/695, 704, 438/720, 714, 963, 906; 216/46, 57, 75, 64, 67

[56]                References Cited

U.S. PATENT DOCUMENTS

| | | | |
|---|---|---|---|
| 4,713,141 | 12/1987 | Tsang ....................................... | 438/720 |
| 5,259,923 | 11/1993 | Horie et al. ............................... | 216/67 |
| 5,302,240 | 4/1994 | Horie et al. ............................... | 438/720 |

FOREIGN PATENT DOCUMENTS

| | | |
|---|---|---|
| 64-86521 | 3/1989 | Japan . |
| 1248522 | 10/1989 | Japan . |
| 5-90225 | 4/1993 | Japan . |
| 5136102 | 6/1993 | Japan . |
| 7130709 | 5/1995 | Japan . |

OTHER PUBLICATIONS

T. Maruyama et al.; "Tungsten etching using an electron cyclotron resonance plasma"; J. Vac. Sci. Technol. A 13(3), May/Jun. 1995; pp. 810–814.

F. Bounasri et al.; "Highly anisotropic etching of submicrometer features on Tungsten"; J. Appl. Phys. 78(11), 1 Dec. 1995; pp. 6780–6783.

Japanese Office Action dated Apr. 28, 1998 with English language translation of Japanese Examiner's comments.

*Primary Examiner*—Janis L. Dote
*Attorney, Agent, or Firm*—Whitham, Curtis & Whitham

[57]                ABSTRACT

A refractory metal layer on a silicon oxide layer is exposed to gaseous etchant containing $SF_6$, $Cl_2$ and CO so as to be patterned; F radical and Cl radical effectively etch the refractory metal, and a reaction product of CO gas does not allow the dry etching to sidewardly proceed so that the dry etching achieves good anisotropy, a large etching rate and a large selectivity to silicon oxide.

11 Claims, 5 Drawing Sheets

METHOD OF DRY ETCHING FOR PATTERNING REFRACTORY METAL LAYER IMPROVED IN ETCHING RATE, ANISOTROPY AND SELECTIVITY TO SILICON OXIDE

FIELD OF THE INVENTION

This invention relates to a semiconductor device fabrication technology and, more particularly, to a method of dry etching for patterning a refractory metal layer.

DESCRIPTION OF THE RELATED ART

An ultra large scale integration has a multi-level wiring structure for connecting circuit components, and tungsten is used for the wirings on inter-level insulating layers and plugs in contact holes. The tungsten further has another attractive property, i.e., a photo-shielding property, and a tungsten layer serves as a photo-shielding layer in a semiconductor solid state image pick-up device such as a charge coupled device.

A refractory metal layer such as the tungsten layer is usually patterned through a reactive ion etching. A typical example of the gaseous etchant available for the reactive ion etching is disclosed in Japanese Patent Publication of Unexamined Application (JPA) No. 1-248522. The Japanese Patent Publication of Unexamined Application teaches two-step dry etching. Gaseous mixture of $SF_6/CCl_3F$ is used in the first step, and the second step is carried out with gaseous mixture of $CCl_3F/N_2$. The two-step dry etching achieves a large etching rate, and little proceeds sidewardly.

Japanese Patent Publication of Unexamined Application (JPA) No. 7-130709 teaches another gaseous etchant available for a tungsten layer. The gaseous etchant is $SF_6/Cl_2/O_2$, and achieves a large selectivity to silicon oxide at 15.

T. Maruyama et. al. proposes gaseous etchant of $SF_6/C_4F_8$ available for tungsten in an electron cyclotron resonance plasma etching system in "Tungsten etching using an electron cyclotron resonance plasma", J. Vac. Sci. Technol. A13(3), pages 810 to 814, May/June 1995. The etchant decreases the amount of side etching.

Japanese Patent Publication of Unexamined Application (JPA) No. 5-136102 teaches another etching gas available for tungsten. The etching gas is CO or $CO_2$, and achieves large selectivity.

However, the prior art gaseous etchants encounter the following problems. The prior art gaseous etchant used in the two-step etching contains chloro-fluoro carbon known as "freon". The freon destroys the ozone of the stratosphere, and is abolished in near future. Therefore, it is impossible to use the gaseous etchant disclosed in Japanese Patent Publication of Unexamined Application No. 1-248522 in the dry etching for the tungsten in near future.

The prior art gaseous etchant disclosed in Japanese Patent Publication of Unexamined Application No. 7-130709 is less anisotropic. When a tungsten layer of 0.5 micron thick is patterned by using the gaseous etchant, the etching proceeds sidewardly by 0.1 micron. Therefore, the gaseous etchant proposed in the Japanese patent Publication of Unexamined Application is not suitable for a micro-patterning.

The prior art gaseous etchant proposed by T. Maruyama et. al. is small in selectivity to silicon oxide. If a thin silicon oxide layer is overlain by a tungsten layer such as a photo-shield layer of a charge coupled device, the gaseous etchant is liable to damage the charge coupled device, and deteriorates the production yield.

Finally, the gaseous etchant disclosed in Japanese Patent Publication of Unexamined Application No. 5-136102 is low in etching rate. The etching rate ranges between 800 angstroms/ min. and 1000 angstroms/min. Therefore, the prior art gaseous etchant deteriorates the producibility of the dry etching technique.

SUMMARY OF THE INVENTION

It is therefore an important object of the present invention to provide a method of a dry etching for patterning a refractory metal layer which is improved in etching rate and selectivity to silicon oxide under a small side etching.

To accomplish the object, the present invention proposes to use gaseous mixture of $SF_6/Cl_2/CO$ as etching gas.

In accordance with the present invention, there is provided a method of dry etching for a refractory metal layer, comprising the steps of: a) preparing a multi-layer structure having a refractory metal layer; and b) exposing the refractory metal layer to gaseous etchant containing $SF_6$, $Cl_2$ and CO so as to etch the refractory metal layer.

The multi-layer structure may be further exposed to gaseous etchant containing $SF_6Cl_2$ and $O_2$ after said step b).

BRIEF DESCRIPTION OF THE DRAWINGS

The features and advantages of the method of dry etching according to the present invention will be more clearly understood from the following description taken in conjunction with the accompanying drawings in which.

DESCRIPTION OF THE PREFERRED EMBODIMENTS

First Embodiment

Figure 1A:
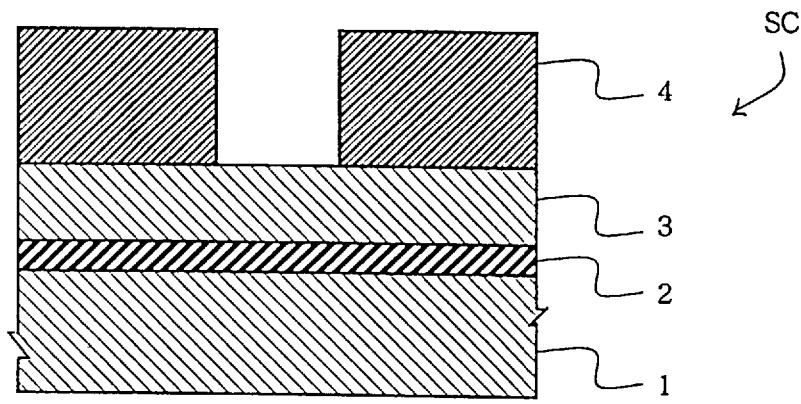
FIGS. 1A to 1C are cross sectional views showing a sequence of a method of dry etching according to the present invention.
Figure 1B:
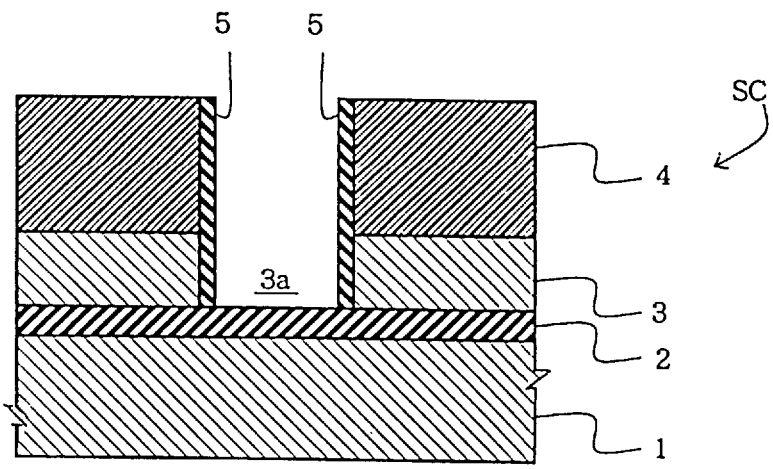
Figure 1C:
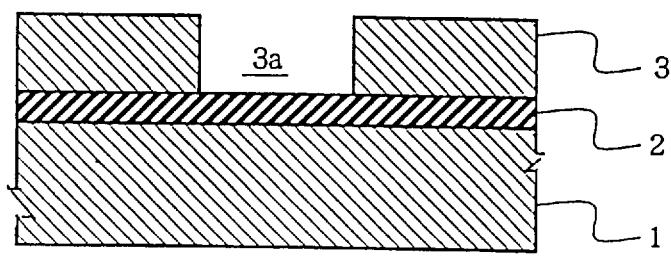

FIGS. 1A to 1C illustrate a method of dry etching embodying the present invention. First, a semiconductor substrate 1 is prepared, and is overlain by a silicon oxide layer 2. Tungsten is deposited to 4000 angstroms thick over the entire surface of the silicon oxide layer 2 by using a sputtering, and form a tungsten layer 3.

Photo-resist solution is spread over the entire surface of the tungsten layer 3, and is baked so that a photo-resist layer covers the tungsten layer 3. A pattern image is optically transferred to the photo-resist layer, and is developed. Then, the photo-resist layer is patterned into a photo-resist etching mask 4 on the tungsten layer 3. The resultant semiconductor structure is shown in FIG. 1A.

Subsequently, the semiconductor structure is placed on a lower electrode 3a of a narrow-gap parallel plate reactive ion etching system 3. The semiconductor structure shown in FIG. 1A is labeled with "SC" in FIG. 2. The lower electrode 3a is opposed to an upper electrode 3b in a reaction chamber 3c, and an etching gas line 3d is connected to the reaction chamber 3c. The upper electrode 3b is connected through a matching box 3e to an rf power source 3f, and the lower electrode 3a is grounded.

The reactive etching is carried out under the following conditions. The flow rate of $SF_6$, the flow rate of $Cl_2$ and the flow rate of CO are regulated to 200 sccm, 10 sccm and 50 sccm, respectively, and the reaction chamber 3c is maintained at 250 milli-torr. The power density of the rf power source 3f is adjusted to 0.55 watt/cm$^2$, and the gap between the electrodes 3a and 3b is 0.8 cm.

$SF_6$ and $Cl_2$ of the gaseous etchant supply F radical and Cl radical to the tungsten layer 3, and F radical and Cl radical etches the tungsten layer 3. This results in a large etching rate. CO produces a reaction product in the carbon system. The reaction product is deposited on the side surface of the tungsten layer 3, and prevents the tungsten from F radical and Cl radical. For this reason, the dry etching vertically proceeds; however, the reaction product does not allow the dry etching to sidewardly proceed. The gaseous etchant achieves a selectivity of 15 with respect to the silicon oxide.

The reactive etching is continued until the silicon oxide layer 2 is exposed. The end point is detectable by monitoring the wavelength of the photo-emission due to F radical at 704 nanometer. When the intensity of the photo-emission at 704 nanometer is rapidly increased, the surface of the silicon oxide layer 2 is exposed to the gaseous etchant, and the manufacturer recognizes that the dry etching reaches the end point.

A through-hole 3a is formed in the tungsten layer 3, and the side surface defining the through-hole 3a is covered with the reaction product 5 as shown in FIG. 1B.

Finally, the semiconductor structure is exposed to oxygen plasma, and the photo-resist etching mask 4 and the reaction product 5 are ashed away as shown in FIG. 1C.

Figure 3:
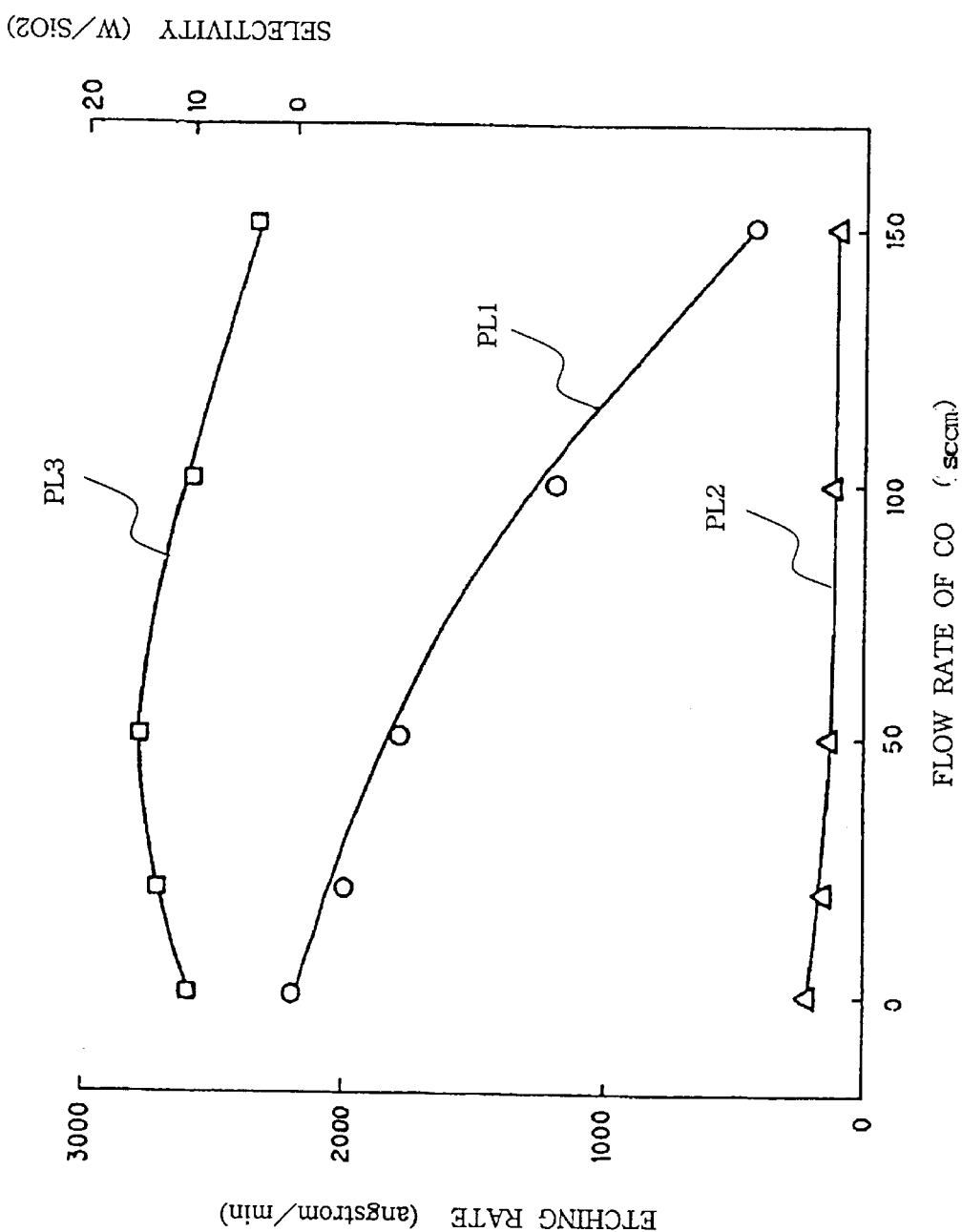
FIG. 3 is a graph showing the selectivity between tungsten and silicon oxide and etching rates thereof in terms of the flow rate of CO contained in gaseous etchant.

The present inventor evaluated the gaseous etchant. The flow rate of $SF_6$ and the flow rate of $Cl_2$ were fixed to 200 sccm and 10 sccm, and the flow rate of CO was varied. The reaction chamber 3c was regulated to 250 milli-torr, and the rf power source 3f was adjusted to 0.55 watt/cm$^2$. As shown in FIG. 3, the etching rate of tungsten and the etching rate of silicon oxide that were observed indicated by plots PL1 and plots PL2, respectively, as shown in FIG. 3 The selectivity was maximized at the CO flow rate of 50 sccm as indicated by plots PL3, as shown in FIG. 3, and was about 15. The etching rate of tungsten at 50 sccm was fairly large, and the large etching rate improved the productivity of the dry etching.

However, when CO gas exceeded 100 sccm, the etching rate of tungsten was decreased. The etching rate of tungsten at 150 sccm was 400 angstroms/min. For this reason, the maximum flow rate of CO was 100 sccm. On the other hand, when the CO gas was less than 50 sccm, the selectivity was decreased due to the shortage of reaction product. For this reason, the minimum flow rate of CO was 20 sccm so as to restrict the side etching. Thus, the large selectivity and the large etching rate to tungsten were achieved by appropriately regulating the flow rate of CO gas.

The present inventor further evaluated the influence of the flow rate of $Cl_2$. The present inventor fixed the flow rate of $SF_6$ to 200 sccm, and changed the flow rate of $Cl_2$ and the flow rate of CO. The etching rates and the selectivity were approximately equal to those indicated by plots PL1, PL2 and PL3 shown in FIG. 3 during the flow rate of $Cl_2$ between 5 sccm and 15 sccm.

Figure 4:
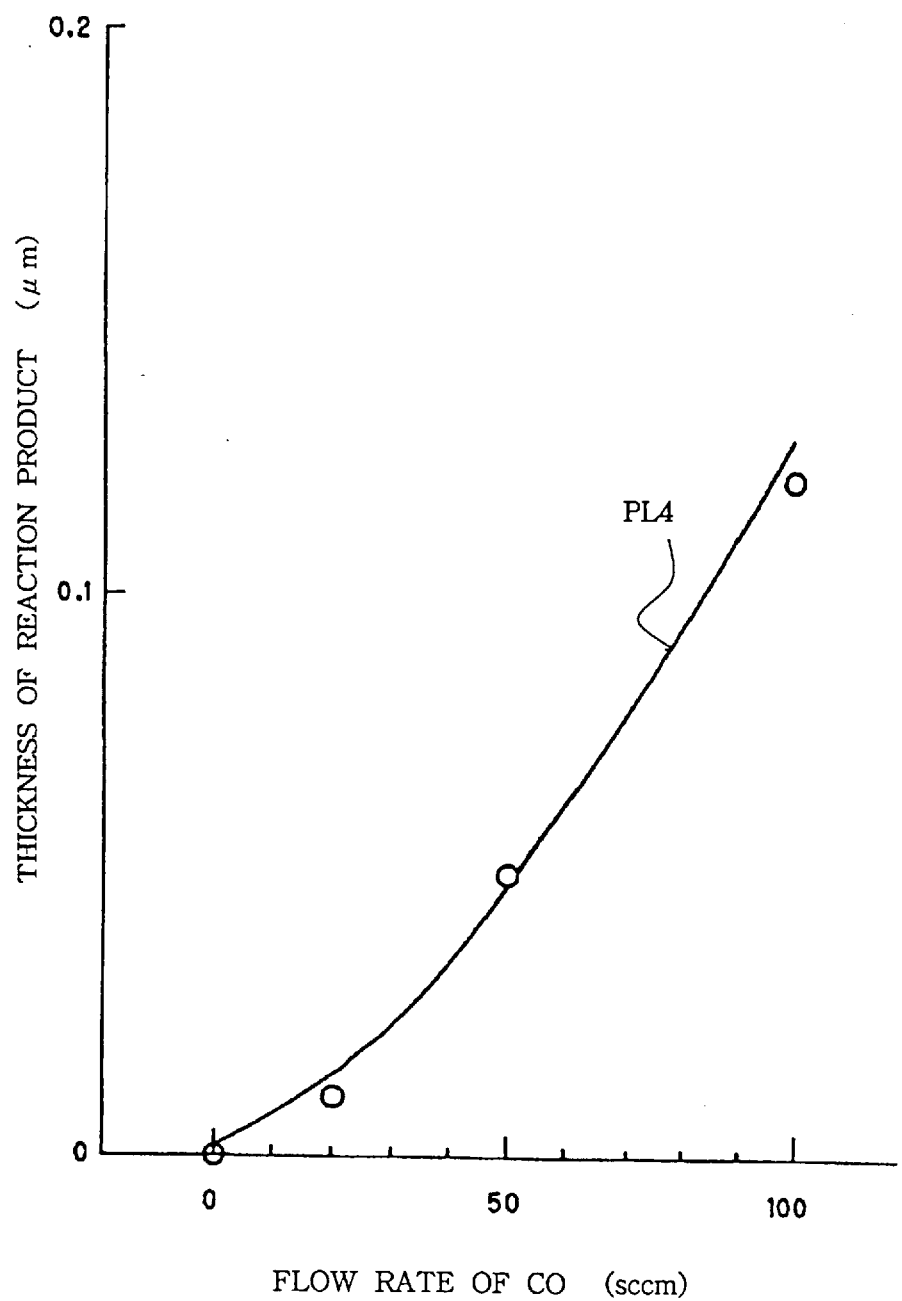
FIG. 4 is a graph showing relation between the flow rate of CO and the thickness of reaction product on a side surface.

The present inventor further measured the thickness of the reaction product 5 in terms of the flow rate of CO. The flow rate of $SF_6$ and the flow rate of $Cl_2$ were fixed to 200 sccm and 10 sccm, and the reaction chamber 3c was regulated to 250 milli-torr. The rf power density was adjusted to 0.55 watt/cm$^2$. As shown in FIG. 4, the thickness of the reaction product 5 was increased together with the flow rate of CO as indicated by Plot PL4. The reaction product 5 was 0.012 micron at 20 sccm, 0.05 micron thick at 50 sccm and 0, 12 microns at 100 sccm. Thus, the present inventor confirmed that the reaction product was produced from CO gas.

The present inventor concluded that the recommendable ratio in flow rate between $SF_6$, $Cl_2$ and CO was 20:0.5–1.5:2–10.

As will be appreciated from the foregoing description, the gaseous etchant of $SF_6$, $Cl_2$ and CO achieves a large etching rate, good anisotropy and a large selectivity to silicon oxide.

Second Embodiment

Figure 5A:
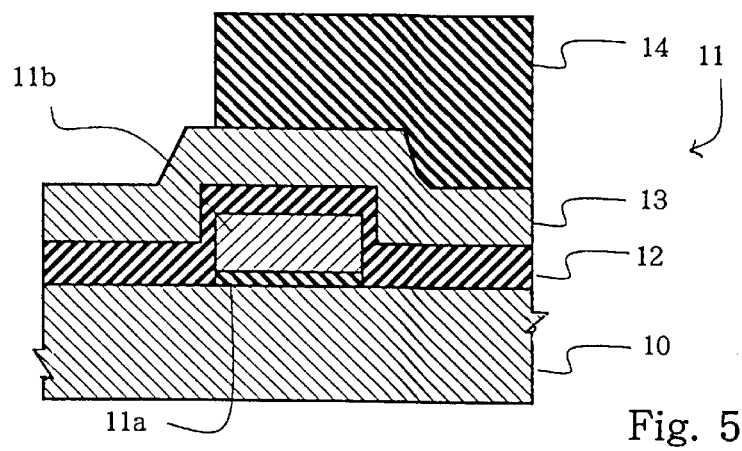
FIGS. 5A to 5C are cross sectional view showing the sequence of another method of dry etching according to the present invention.
Figure 5B:
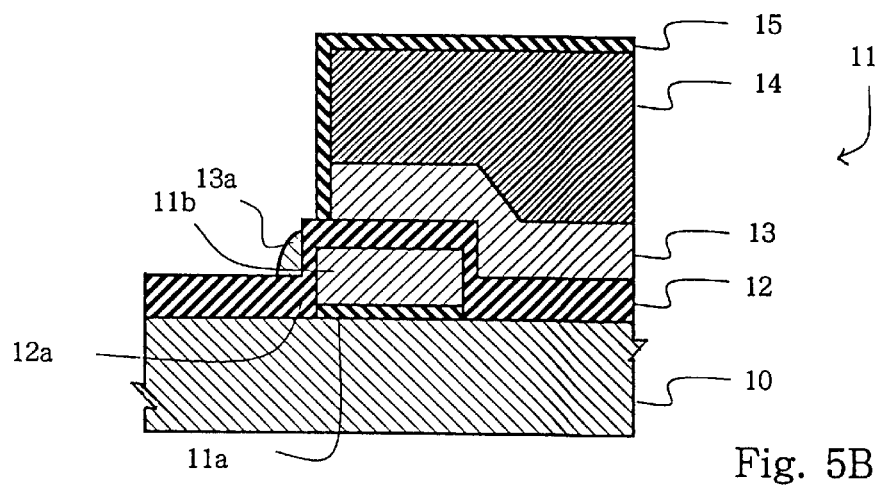
Figure 5C:
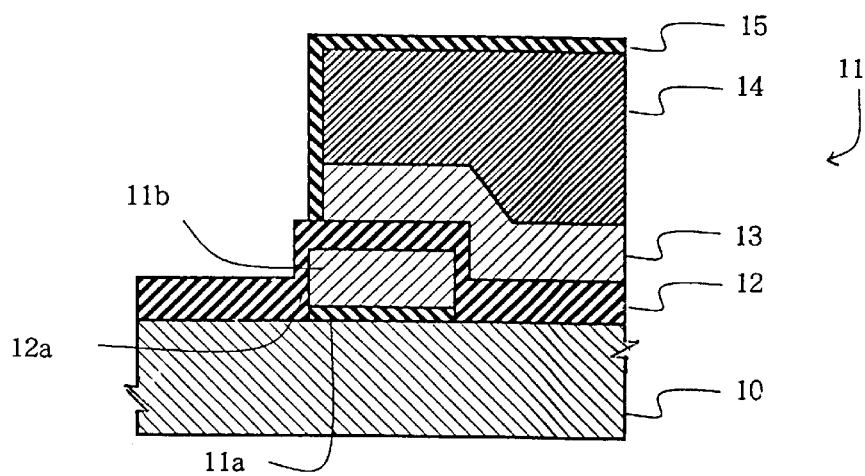

FIGS. 5A to 5C illustrates another sequence of the method of dry etching embodying the present invention. A semiconductor substrate 10 is prepared, and a thick field oxide layer (not shown) is selectively grown on the major surface of the semiconductor substrate 10. The thick field oxide layer defines a plurality of active areas, and one of the plurality of active areas is assigned to a field effect transistor 11.

A thin gate oxide layer 11a is thermally grown on the active area, and a polysilicon layer is deposited over the thin gate oxide layer 11a. A photo-resist etching mask (not shown) is provided on the polysilicon layer, and the polysilicon layer and the thin gate oxide layer 11a are selectively etched away so as to form a gate electrode 11b. Dopant impurity is introduced into the active area in a self-aligned manner with the gate electrode 11b, and forms source and drain regions (not shown) in the active area.

Silicon oxide is deposited over the entire surface of the structure, and forms an inter-level insulating layer 12. Tungsten is deposited over the inter-level insulating layer 12 by using a sputtering, and the inter-level insulating layer 12 is overlain by a tungsten layer 13.

Subsequently, photo-resist solution is spread over the entire surface of the tungsten layer 13, and is baked so as to form a photo-resist layer. A pattern image for an upper wiring is optically transferred to the photo-resist layer, and a latent image is formed in the photo-resist layer. The latent image is developed in developing solution, and the photo-resist layer is patterned into an photo-resist etching mask 14 as shown in FIG. 5A.

Figure 2:
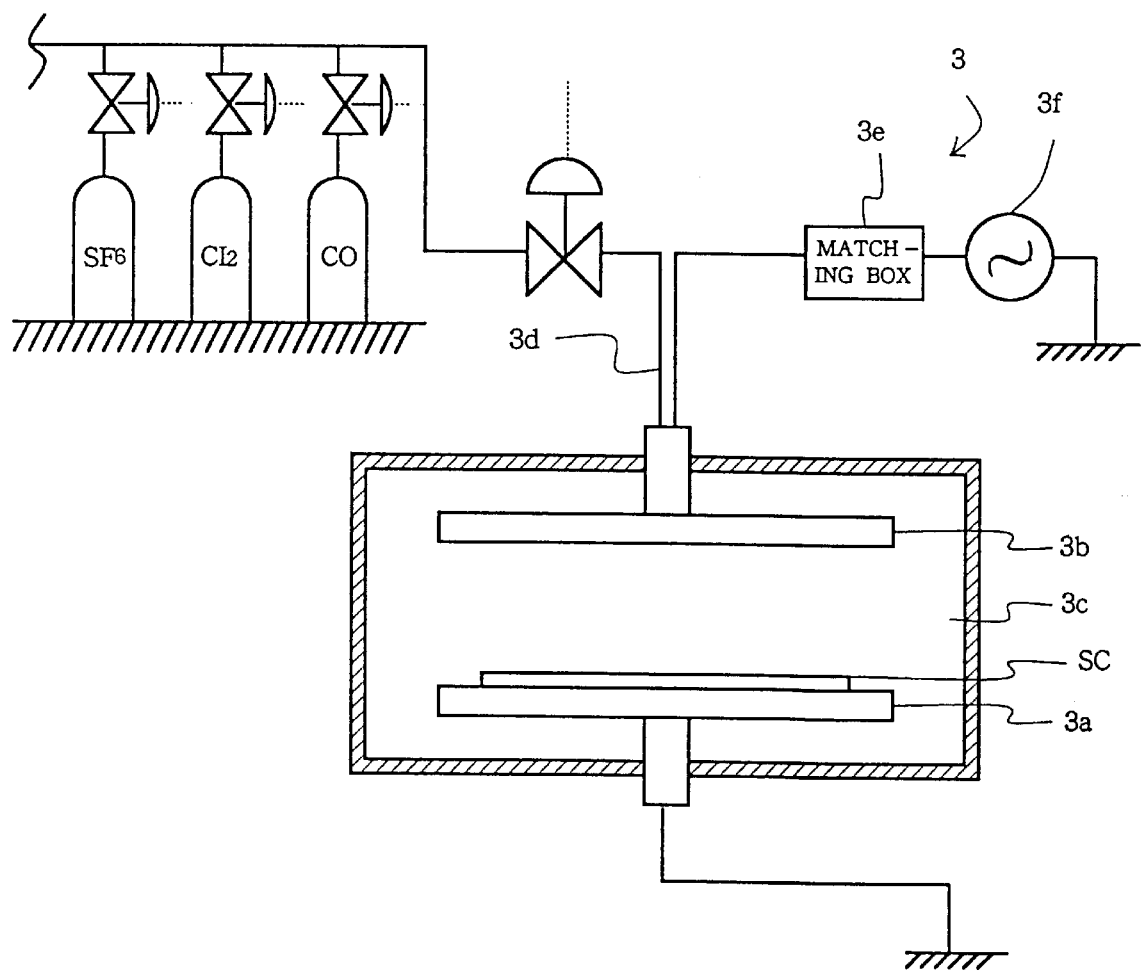
FIG. 2 is a schematic view showing a narrow-gap parallel plate reactive etching system used in the method according to the present invention.

The semiconductor structure shown in FIG. 5A is placed in the narrow-gap parallel plate reactive etching system shown in FIG. 2, and a first-stage etching is carried out by using the gaseous etchant containing $SF_6$, $Cl_2$ and CO. The etching conditions of the first-stage etching are as follows. The flow rate of $SF_6$, the flow rate of $Cl_2$ and the flow rate of CO are 200 sccm, 10 sccm and 100 sccm. The reaction chamber 3c is maintained at 250 milli-torr, and the rf lower density is 0.55 watt/cm$^2$. The gap between the electrodes 3a and 3b is 0.8 cm.

The first-stage etching is continued until the inter-level insulating layer 12 of silicon oxide is exposed, and the end point of the first-stage etching is detected by monitoring the photo-emission of 704 nanometers. The reaction product 15 prevent the tungsten layer 13 under the photo-resist etching mask 14 from F radical and Cl radical, and the first-stage etching hardly proceeds in the lateral direction. Thus, the first-stage etching is anisotropic, and residual tungsten piece 13a is left on the step portion 12a of the inter-level insulating layer 12 as shown in FIG. 5B.

Subsequently, the semiconductor structure shown in FIG. 5B is subjected to a second-stage etching, and gaseous etchant of $SF_6$, $Cl_2$ and $O_2$ is used in the second-stage etching. The etching conditions are as follows. The flow rate of $SF_6$, the flow rate of $Cl_2$ and the flow rate of $O_2$ are 200 sccm, 10 sccm and 50 sccm. The reaction chamber 3c is maintained at 400 milli-torr, and the rf lower density is 0.55 watt/cm$^2$. The gap between the electrodes 3a and 3b is 0.8 cm.

The gaseous etchant in the second-stage etching achieves a large selectivity of about 20 to the silicon oxide, and the inter-level insulating layer 12 is not damaged. Moreover, no reaction product is produced from the gaseous etchant in the second-stage etching, and the second-stage etching sidewardly proceeds. The etching in the second-stage is close to the isotropy. As a result, the gaseous etchant in the second-stage etching perfectly removes the residual tungsten piece 13a. The resultant structure is shown in FIG. 5C.

Finally, the photo-resist etching mask 14 is exposed to mixture of sulfuric acid and hydrogen peroxide. The mixture removes the photo-resist etching mask 14 and the reaction product 15.

As will be appreciated from the foregoing description, the gaseous etchant in the first-stage produces the reaction product 15 from CO gas, and the reaction product prevents the tungsten under the photo-resist etching mask 14 from the F radical and the Cl radical so as to make the first-stage etching anisotropic. As a result, the pattern of the photo-resist etching mask 14 is exactly transferred to the tungsten layer 13. However, the anisotropic etching leaves the residual tungsten piece 13a at the step portion 12a of the inter-level insulating layer 12. The gaseous etchant in the second-stage etching removes the residual tungsten piece 13a from the step portion 12a by virtue of the isotropy. The gaseous etchants in both etching-stages achieve the large selectivity to the silicon oxide, and, for this reason, the inter-level insulating layer is not damaged.

Although particular embodiments of the present invention have been shown and described, it will be obvious to those skilled in the art that various changes and modifications may be made without departing from the spirit and scope of the present invention.

For example, the gaseous etchant according to the present invention is available for patterning another refractory metal such as, for example, titanium and molybdenum.

What is claimed is:

1. A method of dry etching for a refractory metal layer, comprising the steps of:

a) preparing a multi-layer structure having a refractory metal layer;

b) patterning a photo-resist layer on said refractory metal layer into a photo-resist etching mask; and c) exposing said refractory metal layer to a gaseous etchant containing $SF_6$, $Cl_2$ and CO effective to etch said refractory metal layer, wherein a reaction product layer produced from said CO prevents a part of said refractory metal layer located under said photo-resist etching mask from radicals produced from said $SF_6$ and said $Cl_2$.

2. The method as set forth in claim 1, in which said multi-layer structure further has a silicon oxide layer overlain by said refractory metal layer.

3. The method as set forth in claim 2, in which said refractory metal layer is formed of tungsten.

4. The method as set forth in claim 1, further comprising the step of removing said photo-resist etching mask and said reaction product layer after said step c).

5. The method as set forth in claim 4, in which the removal of said photo-resist etching mask and said reaction product layer is achieved by exposing said photo-resist etching mask and said reaction product layer to oxygen plasma.

6. The method as set forth in claim 1, further comprising the step of d) exposing said multi-layer structure to gaseous etchant containing $SF_6$, $Cl_2$ and $O_2$ after said step c).

7. The method as set forth in claim 6, further comprising the step of removing said photo-resist etching mask and said reaction product layer after said step d).

8. The method as set forth in claim 7, in which the removal of said photo-resist etching mask and said reaction product layer is achieved by exposing said photo-resist etching mask and said reaction product layer to mixture of sulfuric acid and hydrogen peroxide.

9. A method of dry etching for a refractory metal layer, comprising the steps of:

a) preparing a multi-layer structure having a refractory metal layer; and b) exposing said refractory metal layer in a reaction chamber to a gaseous etchant containing $SF_6$, $Cl_2$ and CO effective to etch said refractory metal layer, wherein said gaseous etchant is introduced into said reaction chamber at a flow rate ratio between $SF_6$, $Cl_2$ and CO of 20:0.5–1.5:2–10, respectively.

10. The method as set forth in claim 9, further comprising the step of patterning a photo-resist layer on said refractory metal layer into a photo-resist etching mask between said step a) and said step b), wherein a reaction product layer produced from said CO prevents a part of said refractory metal layer located under said photo-resist etching mask from radicals produced from said $SF_6$ and said $Cl_2$.

11. The method as set forth in claim 9, in which said multi-layer structure further has a silicon oxide layer overlain by said refractory metal layer.

* * * * *